United States Patent
Soucy et al.

(10) Patent No.: US 11,288,340 B2
(45) Date of Patent: Mar. 29, 2022

(54) DYNAMICALLY UPDATING A MODEL ASSOCIATED TO A SIMULATED INTERACTIVE OBJECT

(71) Applicant: CAE Inc., Saint-Laurent (CA)

(72) Inventors: Olivier Soucy, Saint-Laurent (CA); Vincent Myrand-Lapierre, Saint-Laurent (CA)

(73) Assignee: CAE Inc., St.-Laurent (CA)

( * ) Notice: Subject to any disclaimer, the term of this patent is extended or adjusted under 35 U.S.C. 154(b) by 431 days.

(21) Appl. No.: 15/086,343

(22) Filed: Mar. 31, 2016

(65) Prior Publication Data

US 2017/0286571 A1    Oct. 5, 2017

(51) Int. Cl.
*G06F 17/50*    (2006.01)

(52) U.S. Cl.
CPC ...... *G06F 17/5009* (2013.01); *G06F 17/5095* (2013.01)

(58) Field of Classification Search
None
See application file for complete search history.

(56) References Cited

U.S. PATENT DOCUMENTS

| | | | |
|---|---|---|---|
| 7,236,914 B1 | 6/2007 | Zyskowski | |
| 7,801,714 B2 * | 9/2010 | Villey | G09B 9/08 703/7 |
| 8,393,902 B2 * | 3/2013 | VanBiervliet | G09B 9/12 434/28 |
| 8,589,131 B2 * | 11/2013 | Gonzalez Cuadrado | G09B 9/46 703/1 |
| 9,652,584 B2 * | 5/2017 | Hansen | G06F 17/5095 |
| 2010/0318336 A1 * | 12/2010 | Falangas | G05B 17/02 703/8 |
| 2014/0207429 A1 * | 7/2014 | Spira | G06F 17/5009 703/2 |

OTHER PUBLICATIONS

Vorst, J., et al. "Flight mechanics model development for a ka32 training simulator." (2009).*

(Continued)

*Primary Examiner* — Aniss Chad
*Assistant Examiner* — Nithya J. Moll
(74) *Attorney, Agent, or Firm* — Gowling WLG (Canada) LLP

(57) ABSTRACT

A method and computer system for dynamically updating a model associated to a simulated interactive object in an interactive computer simulation comprising a computer generated environment. In real-time, a simulated behavior of the simulated interactive object is provided considering the model associated thereto. After reception of a request to modify the model, a new model is determined and validated by computing a validation indicator. The validation indicator computation considers interrelated parameters associated to the model and simulated constraints associated to the computer generated environment. The model is then selectively and dynamically updated into a new model considering at least the validation indicator. Subsequently, in real-time, an updated simulated behavior of the simulated interactive object is provided correspondingly considering the model or the new model associated thereto.

18 Claims, 4 Drawing Sheets

(56) References Cited

OTHER PUBLICATIONS

Mittal, S. et al, "DEVS-Based Dynamic Model Reconfiguration and Simulation Control in the Enhanced DoDAF Design Process", JDMS, vol. 3, Issue 4, Oct. 2006, pp. 239-267. *figure 5 and pp. 249, 252, 253 and 262*.
Perez, F. et al., "Vehicle simulation on an engine test bed", SIA International Conference, May 28 & 29, 2008, pp. 1 to 8.
International Search Report for International Application No. PCT/CA2016/000096, "Dynamically Updating a Model Associated to a Simulated Interactive Object," dated Dec. 12, 2016.

* cited by examiner

DYNAMICALLY UPDATING A MODEL ASSOCIATED TO A SIMULATED INTERACTIVE OBJECT

PRIORITY STATEMENT

This non-provisional patent application claims priority based upon the PCT patent applications entitled "DYNAMICALLY UPDATING A MODEL ASSOCIATED TO A SIMULATED INTERACTIVE OBJECT", filed on even date herewith, in the name of CAE Inc., which is hereby incorporated by reference.

TECHNICAL FIELD

The present invention relates to interactive computer simulations and, more particularly, to modeling of simulated objects in interactive computer simulations.

BACKGROUND

In an interactive computer simulation such as a flight simulator, the quality of the user's experience is related, among other things, to the plausibility of the user's interactions in the simulator and to the predictability of the results of such interactions. For instance, the behavior of an airplane needs to be plausible and sufficiently predictable in relation to simulated conditions and in relation to commands from the user in the simulator. Of course, different airplanes or airplane configurations may be supported in certain simulators, each having different expected behaviors. In addition, experimental airplanes or airplane configurations may also be tested in flight simulators.

One of the problems when experimenting with modeled airplanes or airplane configurations in a simulator comes from the possibility of providing an unpredictable and implausible solution to the user. The present invention addresses this concern.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A first aspect of the present invention is directed to a method for dynamically updating a model associated to a simulated interactive object in an interactive computer simulation. The method comprises running the interactive computer simulation comprising a display module and at least one interactive instrument module. The interactive computer simulation comprises the simulated interactive object in a computer generated environment of the interactive computer simulation. The method comprises in real-time during the interactive computer simulation, monitoring the at least one interactive instrument module for user inputs causing a simulated behavior of the simulated interactive object considering the model associated thereto. Images from the interactive computer simulation are shown on at least one display screen of the display module in relation to the simulated behavior. After reception of a request to modify the model associated to the simulated interactive object, the method follows with determining a new model associated to the simulated interactive object and validating the new model associated to the simulated interactive object by computing a validation indicator. The validation indicator is computed from a plurality of interrelated parameters of the new model and a plurality of simulated constraints associated to the computer generated environment. The method then follows with selectively and dynamically updating the model associated to the simulated interactive object into the new model considering at least the validation indicator. Afterwards, in real-time during the interactive computer simulation, the at least one interactive instrument module is monitored for additional user inputs causing an updated simulated behavior of the simulated interactive object in the interactive computer simulation correspondingly considering the model or the new model associated thereto. Additional images from the interactive computer simulation are shown on the at least one display screen of the display module in relation to the updated behavior.

In exemplary embodiments, the simulated interactive object may be a simulated aircraft. In this example, the plurality of interrelated parameters may comprise a drag value, a side-force value, a lift value, a pitch value, a roll value, a yaw value and a power profile as well as translational velocity derivatives, angular velocity derivatives and control derivatives and the plurality of simulated constraints associated to the computer generated environment may comprise gravitational force and atmospheric pressure.

In one embodiment, the model comprises a plurality of original interrelated parameters and the simulated interactive object exhibits the simulated behavior based on the original plurality of interrelated parameters. Determining the new model may then comprise computing the plurality of interrelated parameters, one or more of the plurality of interrelated parameters being different when compared to the corresponding plurality of original interrelated parameters. The request may comprise a target value for a single parameter of the plurality of interrelated parameters and the request may be for validating the effect of modifying the single parameter in the interactive computer simulation.

The method may optionally further comprise receiving the request to modify the model comprising a target value for one or more of the plurality of interrelated parameters. Optionally, the request may comprise a compound target value for updating one or more behavioral aspects of the model into the updated behavior. Validating the new model may further comprise computing one or more of the plurality of interrelated parameters of the new model from the compound target value.

Optionally, selectively and dynamically updating the model into the new model considering at least the validation indicator may further comprise, when the validation indicator shows that the new model is valid, updating the model into the new model and, when the validation indicator shows that the new model is invalid, providing a user interface choice. Upon receipt of a response from the user interface choice to apply the new model as-is, the model may be updated into the new model and upon receipt of a response from the user interface choice to reject the new model, the model may be kept. Upon receipt of a response from the user interface choice to update the model into a maximum valid model, until the new model corresponds to the maximum valid model, one or more interrelated parameters from the plurality interrelated parameters may be modified considering the request before updating the model into the maximum valid model.

The method may further optionally comprise, after reception of the request to modify the model, pausing the interactive computer simulation for allowing determination, validation and update of the new model and, after selectively and dynamically updating the model into the new model, resuming the interactive computer simulation.

The request may comprise a random model request and determining the new model associated to the simulated interactive object may then comprise providing a random model associated to the simulated interactive object.

The request may also comprise a model identification request and determining the new model associated to the simulated interactive object may then comprise providing an existing model associated to an identifiable version of the simulated interactive object.

The method may comprise receiving the request from an Instructor Operating Station (IOS) associated to the interactive computer simulation or from the interactive instrument module.

A second aspect of the present invention is directed to a computer system for dynamically updating a model associated to a simulated interactive object in an interactive computer simulation. The computer system comprises a display module, an interactive instrument module for receiving user inputs related to the simulated interactive object in the interactive computer simulation and a processor module. The processor module is configured to run the interactive computer simulation comprising the simulated interactive object in a computer generated environment of the interactive computer simulation and, in real-time during the interactive computer simulation, monitor the interactive instrument module for the user inputs. The processor module is also configured to, upon receipt of the user inputs, cause a simulated behavior of the simulated interactive object in the interaction computer simulation considering the model and the user inputs and cause the display module to display images, on at least one display screen, from the interactive computer simulation in relation the simulated behavior. After receipt of a request to modify the model associated to the simulated interactive object, the processor module is further configured to determine a new model associated to the simulated interactive object, validate the new model associated to the simulated interactive object. The validation indicator is computed by the processor module from a plurality of interrelated parameters of the new model and a plurality of simulated constraints associated to the computer generated environment. The processor module is configured to then selectively and dynamically update the model associated to the simulated interactive object into the new model considering at least the validation indicator. Thereafter, the processor module is also configured to, in real-time during the interactive computer simulation, monitor the interactive instrument module for additional user inputs, cause an updated simulated behavior of the simulated interactive object in the interactive computer simulation considering the additional user inputs and, correspondingly, the model or the new model associated to the simulated interactive object and cause the display module to display additional images, on the at least one display screen, from the interactive computer simulation in relation to the updated simulated behavior.

The model may comprise a plurality of original interrelated parameters and the simulated interactive object may exhibit the simulated behavior based on the original plurality of interrelated parameters. Determining the new model may then comprise computing the plurality of interrelated parameters, one or more of the plurality of interrelated parameters being different when compared to the corresponding plurality of original interrelated parameters.

The processor module may be further configured to, when selectively and dynamically updating the model into the new model considering at least the validation indicator, when the validation indicator shows that the new model is valid, update the model into the new model and when the validation indicator shows that the new model is invalid, provide a user interface choice. Upon receipt of a response from the user interface choice to apply the new model as-is, the processor module may be configured to update the model into the new model. Upon receipt of a response from the user interface choice to reject the new model, the processor module may be configured to keep the model. Upon receipt of a response from the user interface choice to update the model into a maximum valid model, the processor module may be configured to, until the new model corresponds to the maximum valid model, modify one or more interrelated parameters from the plurality interrelated parameters considering the request and update the model into the maximum valid model.

The processor module may be configured to, after reception of the request to modify the model, pause the interactive computer simulation for allowing determination, validation and update of the new model and, after selectively and dynamically updating the model into the new model, resume the interactive computer simulation.

The computer system may further comprise a network interface module for receiving the request from an Instructor Operating Station (IOS).

BRIEF DESCRIPTION OF THE DRAWINGS

Further features and exemplary advantages of the present invention will become apparent from the following detailed description, taken in conjunction with the appended drawings, in which.

DETAILED DESCRIPTION

Figure 1:
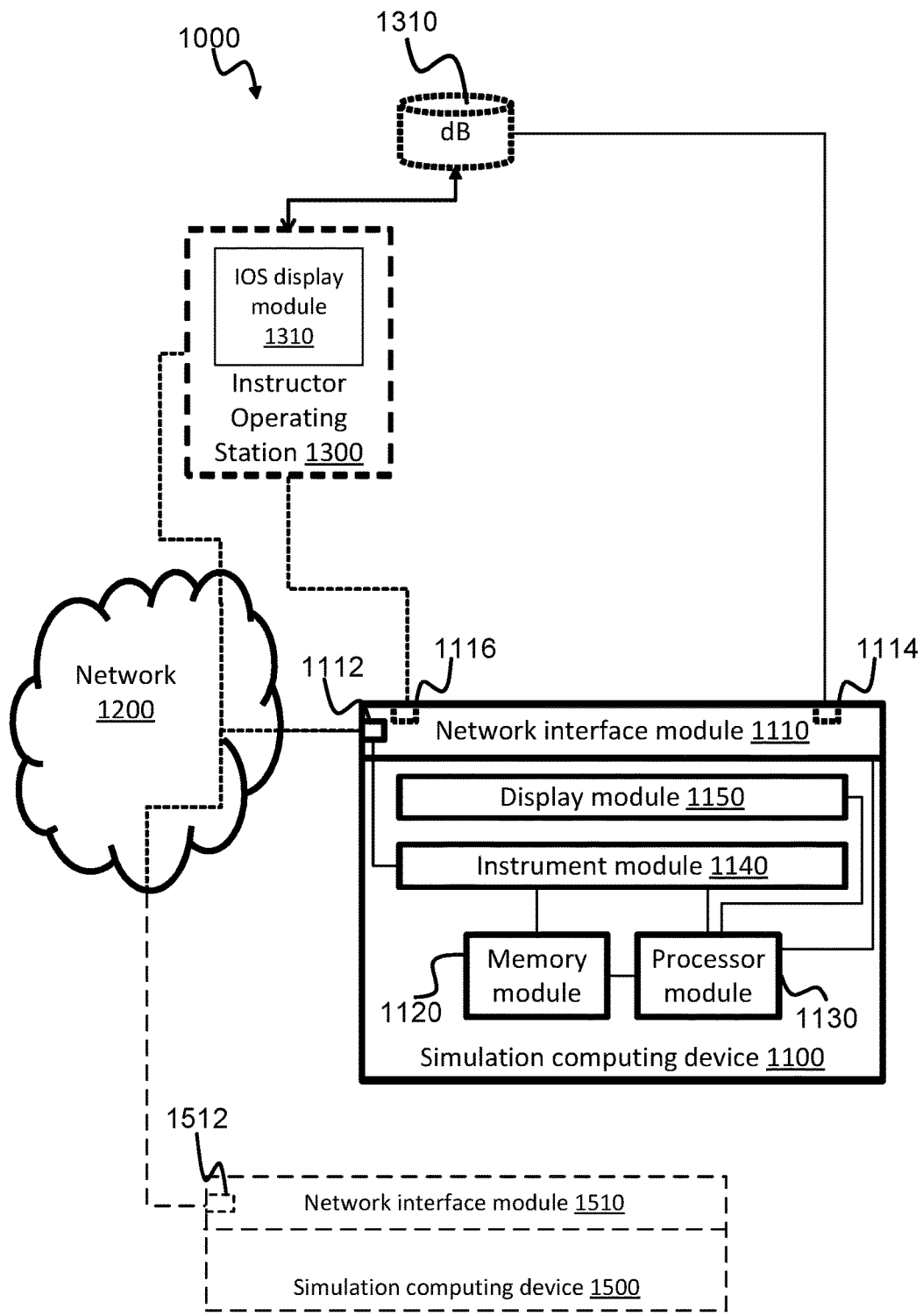
FIG. 1 is a logical modular representation of an exemplary computer system in accordance with the teachings of the present invention.

In an interactive computer simulation, a computer generated environment is provided with different structures (e.g., buildings, streets, airports, lakes, rivers, etc.) and certain sets of rules. For instance, the computer generated environment may specify a constant gravitational force value and a variable air pressure value that varies as a function of altitude in the computer generated environment. Of course, as skilled persons will readily recognize, the gravitational force value may also be set as a function of distance to one or more planets, which would be critical if the interactive computer simulation was related to space travel. Many other rules are also set in the interactive computer simulation (e.g., weather parameters, parameterized lighting conditions, etc.), which may be set to replicate a realistic environment, an expected environment or a fictitious one, depending on the context of the interactive computer simulation. The computer generated environment may also comprise other dynamic representations (e.g., simulated moving vehicles, simulated humans, etc.). The interactive computer simulation also comprises one or more simulated interactive objects controlled by at least one user of the interactive computer simulation. For instance, the simulated interactive object may be a vehicle (e.g., airplane, helicopter, spacecraft, tank, etc.), a human (e.g., a physician in a hospital), a control panel (e.g., from a nuclear central, air traffic controller station) etc. A physical instrument module is provided for the user to control the simulated interactive object in the interactive computer simulation. The simulated interactive object is defined by a model in the interactive computer simulation. The model sets the capacity and characteristics of the simulated interactive object in the computer generated environment. For instance, in the case of a simulated airplane, the corresponding model sets the lift force at different airspeed considering the airplane angle of attack in the air and flap position. Of course, many other parameters also define how the simulated airplane must behave in the interactive computer simulation.

The model for the interactive simulated object contains a plurality of interrelated parameters. That is, the value of a single parameter defines many aspects of the simulated behavior of the simulated object. As such, setting one value for one of the model parameters has an impact on many aspects of the simulated behavior of the interactive object in the interactive computer simulation. It is difficult to predict the effect of a modification of any parameters on the simulated behavior of the simulated object. It is also equally difficult to predict whether the ensuing model following the modification will represent a desirable and predictable version of the interactive simulated object. Likewise, when creating a new model for an interactive simulated object (or when modeling an interactive simulated object), it is difficult to set the multiple parameters and obtain a plausible and predictable interactive simulated object.

In the context of the depicted embodiments, access is provided to at least some of the plurality of parameters defining the model of an interactive simulated object during the interactive computer simulation. That is, a user of the interactive computer simulation is able to modify certain parameters of the model of the interactive simulated object during the interactive computer simulation. The interactive computer simulation may be paused or frozen while the user attempts to modify the parameters. The actual modifiable parameters made accessible to the user may represent a single parameter (e.g., value of a power coefficient of the modeled interactive simulated object) or may represent a compound parameter for which more than one individual parameter is modified (e.g., maximum and minimum stable pitch vs. speed of the modeled interactive simulated object).

Before any modification is applied, however, a validation process ensures that the modified or resulting new model presents a valid solution, i.e., a plausible and predictable version of the interactive simulated object considering limits and constraints of the computer generated environment. The validation process may further translate the compound parameter into the discrete parameters to be modified in the model. The suggested modifications may simply fit within workable boundaries of the model of the interactive simulated object and may thus be applied as-is by the validation process. In other instances, the suggested modifications may provide for an invalid model, i.e., a model that would not provide a workable version of the interactive simulated object. In this case, the validation process may i) refuse the modification and revert to the previous state, ii) set the suggested parameter to the closest valid value or, iii) confirm with the user that the parameter will be set outside of the workable boundaries before applying the suggested modification. The user may also be provided with a choice between these options. An option may also be offered to persistently store one or more of the new models for future reference. The user may also be offered a mode in which the modification is applied step-by-step (e.g., at a fixed or tunable rate) from the current value to the suggested value (which could be within the boundaries or not), thereby allowing the user to determine the effect of the modified parameter on a range of values. While the step-by-step modification could be made gradually, it is expected that the computation time required for the validation process and the process responsible for applying the new model in the interactive computer simulation will cause a perceptible delay between the request for modification of the parameter and availability of the new model in the interactive computer simulation. During the delay, the interactive computer simulation may be frozen or paused. The user may also be offered to switch between a baseline model of the interactive simulated object and the modified model. When many modifications are successively or concurrently performed from the baseline model, the comparison may be made at the parameter level, at the compound parameter level or on the complete model level. The switch may be applied gradually (e.g., at a fixed or tunable rate) or as instantaneously as possible.

In another mode, some or all of the parameters of the model may be randomly modified (e.g., within the workable) boundaries to provide a random yet valid model of the interactive simulated object (e.g., by the validation process). This mode may be simply provided as a game mode, but may also further be used to assess the flexibility of the user to adapt to a new model. When only a subset of parameters or when a single parameter is modified, this may also allow to verify assumptions concerning effects of the modification on the resulting model. Alternatively, the resulting model may not be random, but may be selected from a subset of known configurations. For instance, the resulting model may be selected from a subset of models representing all the aircrafts sharing a common or compatible cockpit configuration. The user may then be asked to identify the correct aircraft model.

The interface allowing modifications to the model may be offered to the actual user of the interactive computer simulation and/or may also be offered to a second user or a supervisory user. The second user or supervisory user may be co-located with the user (e.g., in a single flight simulator room) or may be remote therefrom (e.g., same or different building).

The interactive computer simulation may, for instance, be used for training purposes and/or for enacting a scenario from historical data (e.g., from a recording of a surgical procedure, from an event recording device (e.g., black box) from an aircraft, a train, etc.). The interactive computer simulation may be scenario-based (e.g., where simulation code driving the interactive computer generated environment comprises one or more predetermined events, motions, sounds, etc.).

The interactive computer simulation may be a training simulation program such as a flight simulation software or a healthcare simulation software. The computer generated environment is related to the interactive computer simulation (e.g., a virtual representation of a real or fictional region of the world, a virtual representation of a real or fictional hospital) where the interactive computer simulation can take place (e.g., the Greater Montreal area with a detailed representation of at least some of its airports or a fully-equipped operating room from Hôpital Ste-Justine de Montréal). The interactive computer simulation may also be related to a vehicle interactive computer simulation involving one or more simulated vehicle(s). The interactive computer simulation may be a (e.g., single or multiple vehicles simultaneously). The present invention is not limited by the type of interactive simulated vehicle, which may be terrestrial (car, tank, etc.), underground, airborne (e.g., an aircraft, a space shuttle), floating (e.g., a boat), etc. The interactive computer simulation may also be related to a game, which could differ from the training simulation because of the different rules that apply in the computer generated environment (e.g., varying gravity force, presence of unrealistic elements (force fields), varying response to damages, varied capacity to undo or affect past actions, success measured on different results, etc.).

Reference is now made to the drawings in which FIG. 1 shows a logical modular representation of an exemplary computer system 1000 for dynamically updating a model associated to a simulated interactive object of an interactive computer simulation, in accordance with the teachings of the present invention. The computer system 1000 comprises a simulation computing device 1100. In some embodiments, the simulation computing device 1100 is a training device executing a flight simulation software or a healthcare simulation software.

The simulation computing device 1100 comprises a processor module 1130, which may represent a single processor with one or more processor cores or an array of processors, each comprising one or more processor cores. The simulation computing device 1100 comprises a memory module 1120, which may comprise various types of memory (different standardized or kinds of Random Access Memory (RAM) modules, memory cards, Read-Only Memory (ROM) modules, programmable ROM, etc.). The simulation computing device 1100 most often, albeit not always, comprises a network interface module 1110 that present at least one physical interface 1112/1114/1116 that can be used to communicate with other networked nodes, e.g., though a network 1200 (e.g., 1112) or directly (e.g., 1114/1116). The network interface module 1110 may be made visible to the other modules of the simulation computing device 1100 through one or more logical interfaces. The actual stacks of protocols used by the physical network interface(s) and/or logical network interface(s) of the network interface module 1110 do not affect the teachings of the present invention. The variants of processor module 1130, memory module 1120 and network interface module 1110 usable in the context of the depicted embodiments will be readily apparent to persons skilled in the art. Likewise, even though explicit mentions of the memory module 1120 and/or the processor module 1130 are not made throughout the description of the present examples, persons skilled in the art will readily recognize that such modules are used in conjunction with other modules of the simulation computing device 1100 to perform routine as well as innovative steps related to the present invention.

The simulation computing device 1100 also comprises a display module 1150 comprising one or more display screen(s). The display screens of the display module 1150 could be split into one or more flat panels, but could also be a single flat or curved screen visible from an expected user position (not shown) in the simulation computing device 1100. For instance, the display module 1150 may comprise one or more mounted projectors for projecting images on a curved refracting screen. The curved refracting screen may be located far enough from the user of the interactive computer program to provide a collimated display. Alternatively, the curved refracting screen may provide a non-collimated display.

The simulation computing device 1100 also comprises an instrument module 1140 for the user to interact within the computer generated environment. The instrument module 1140 may comprise one or more physical module that may further be interconnected to provide a given configuration of the interactive computer program. The instrument module 1140 is expected to be manipulated by the user of the interactive computer simulation to input commands thereto. The instrument module 1140 may be used for providing feedback to the user of the interactive computer simulation through simulated instrument(s) (e.g., touch screens, or replicated elements of an aircraft cockpit or of an operating room). Additional feedback devices may be provided with the simulation computing device 1110 or in the computer system 1000 (e.g., vibration of an instrument, physical movement of a seat of the user and/or physical movement of the whole system, etc.).

For instance, in relation to an exemplary flight simulator embodiment, the instrument module 1150 may comprise a control yoke and/or side stick, rudder pedals, a throttle, a flap switch, a transponder, a landing gear lever, a parking brake switch, aircraft instruments (air speed indicator, attitude indicator, altimeter, turn coordinator, vertical speed indicator, heading indicator, . . . ), etc.

The simulation computing device 1100 may also comprise one or more seats (not shown) or other ergonomically designed tools (not shown) to assist the user of the interactive computer simulation in getting into proper position to gain access to some or all of the instrument module 1140.

The computer system 1000 may also comprise a storage devices module 1310, which may represent one or more logical or physical as well as local or remote hard disk drive (HDD) (or an array thereof). The storage devices module 1310 may further represent a local or remote database made accessible to the simulation computing device 1100 and/or other components of the computer system 1000 by a standardized or proprietary interface.

In the depicted example of FIG. 1, the computer system 1000 shows an optional second simulation computing device 1500, which may communicate through the network 1200 with the simulation computing device 1100 through an interface 1512 of a network interface module 1510. The second simulation computing device 1500 may be associated to the same instance of the interactive computer simulation with a shared computer generated environment where users of the simulation computing devices 1100 and 1500 may interact with one another in a single simulation. The single simulation may also involve other simulation computing device(s) (not shown) co-located with the simulation computing device 1100 or remote therefrom. The simulation computing device 1100 and 1500 may also be associated to different instances of the interactive computer simulation, which may further involve other simulation computing device(s) (not shown) co-located with the simulation computing device 1100 or remote therefrom.

The computer system 1000 exemplified on FIG. 1 also shows an optional Instructor Operating Station (IOS) 1300. The IOS 1300 may be used for allowing an instructor to participate to the interactive computer simulation and possibly additional interactive computer simulation(s). The IOS 1300 may be co-located with the simulation computing device 1100 (e.g., within the same room or simulation enclosure) or remote therefrom (e.g., in different rooms or in different locations). The IOS 1300 may provide a computer simulation management interface, which may be displayed on an IOS display module 1310, which may comprise one or more display screens such as a wired or wireless flat screen, a wired or wireless touch-sensitive display, a tablet computer, a portable computer or a smart phone. The IOS 1300 could be located in close proximity with the simulation computing device 1100, but may also be provided outside of the computer system 1000, in communication therewith. When multiple simulation computing devices 1100 and 1500 are present in the computer system 1000, the IOS 1300 may present different views of the computer program management interface (e.g., to manage different aspects therewith) or they may all present the same view thereof. The computer program management interface may be permanently shown on a first of the screens of the IOS display module 1310 while a second of the screen of the IOS display module 1310 shows a view of the interactive computer simulation (i.e., adapted view considering the second screen from images displayed through the display module 1150). The computer program management interface may also be triggered on the IOS 1300, e.g., by a touch gesture and/or an event in the interactive computer program (e.g., milestone reached, unexpected action from the user, or action outside of expected parameters, success or failure of a certain mission, etc.). The computer program management interface may provide access to settings of the interactive computer simulation and/or of the simulation computing device 1100. A virtualized IOS (not shown) may also be provided to the user on the display module 1150 (e.g., on a main screen, on a secondary screen or a dedicated screen thereof).

In the context of the depicted embodiments, runtime execution, real-time execution or real-time priority processing execution corresponds to operations executed during the interactive computer simulation that may have an impact on the perceived quality of the interactive computer simulation from a user perspective. An operation performed at runtime, in real-time or using real-time priority processing thus typically needs to meet certain performance constraints that may be expressed, for instance, in terms of maximum time, maximum number of frames, and/or maximum number of processing cycles. For instance, in an interactive simulation having a frame rate of 60 frames per second, it is expected that a modification performed within 5 to 10 frames will appear seamless to the user. Skilled persons will readily recognize that real-time processing may not actually be achievable in absolutely all circumstances in which rendering images is required. The real-time priority processing required for the purpose of the disclosed embodiments relates to perceived quality of service by the user of the interactive computer simulation, and does not require absolute real-time processing of all dynamic events, even if the user was to perceive a certain level of deterioration of quality of service that would still be considered plausible.

A simulation network (e.g., overlaid on the network 1200) may be used, at runtime (e.g., using real-time priority processing or processing priority that the user perceives as real-time), to exchange information (e.g., event-related simulation information). For instance, movements of a vehicle associated to the simulation computing device 1100 and events related to interactions of a user of the simulation computing device 1100 with the interactive computer generated environment may be shared through the simulation network. Likewise, simulation-wide events (e.g., related to persistent modifications to the interactive computer generated environment, lighting conditions, modified simulated weather, etc.) may be shared through the simulation network from a centralized computer system (not shown). In addition, the storage module 1310 (e.g., a networked database system) accessible to all components of the computer system 1000 involved in the interactive computer simulation may be used to store data necessary for rendering interactive computer generated environment. In some embodiments, the storage module 1310 is only updated from the centralized computer system and the simulation computing devices 1100, 1500 only load data therefrom.

Figure 2:
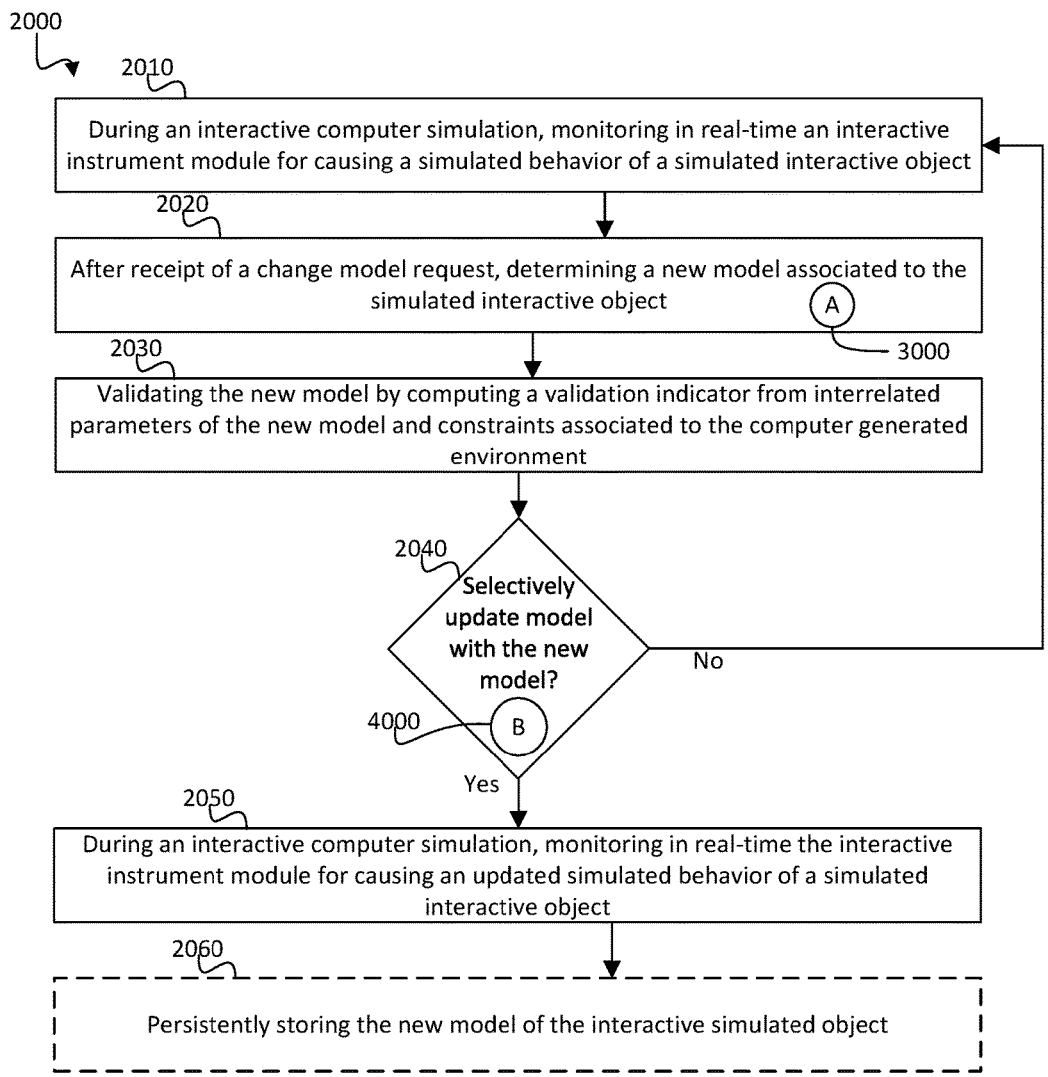
FIG. 2 is a flow chart of an exemplary method in accordance with the teachings of the present invention.
Figure 3:
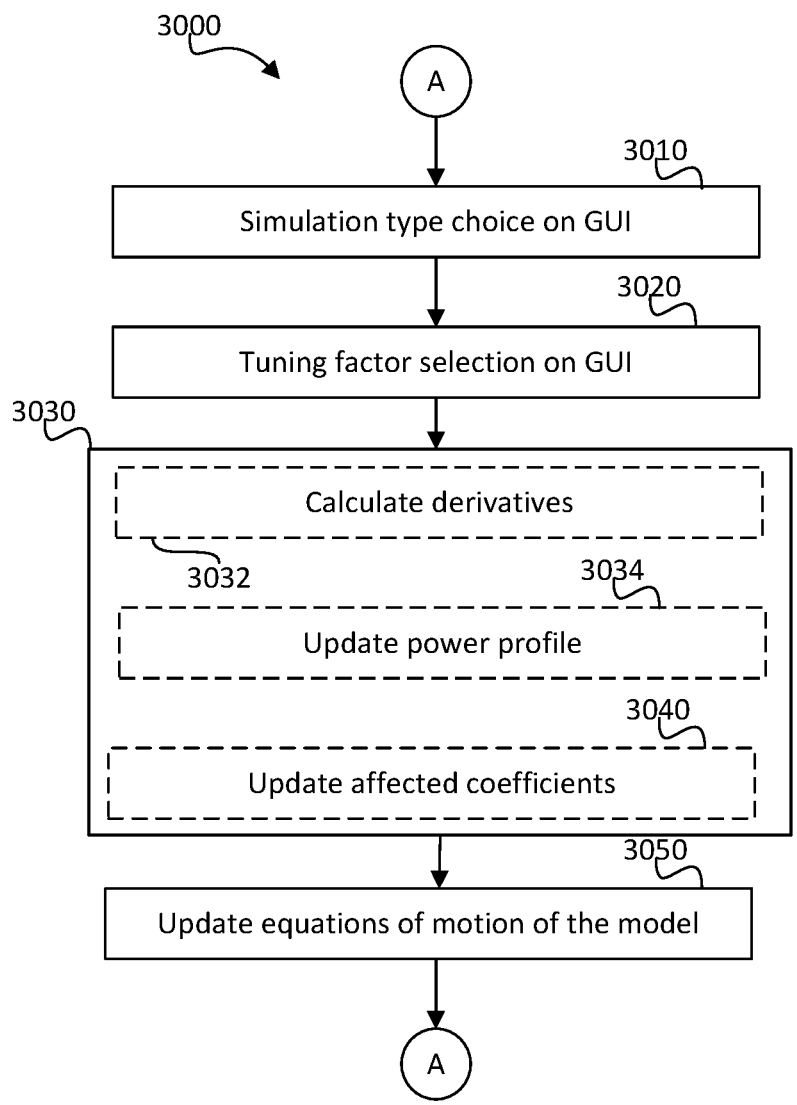
FIG. 3 is a more detailed flow chart of a first portion of the exemplary method depicted in FIG. 2, in accordance with the teachings of the present invention.
Figure 4:
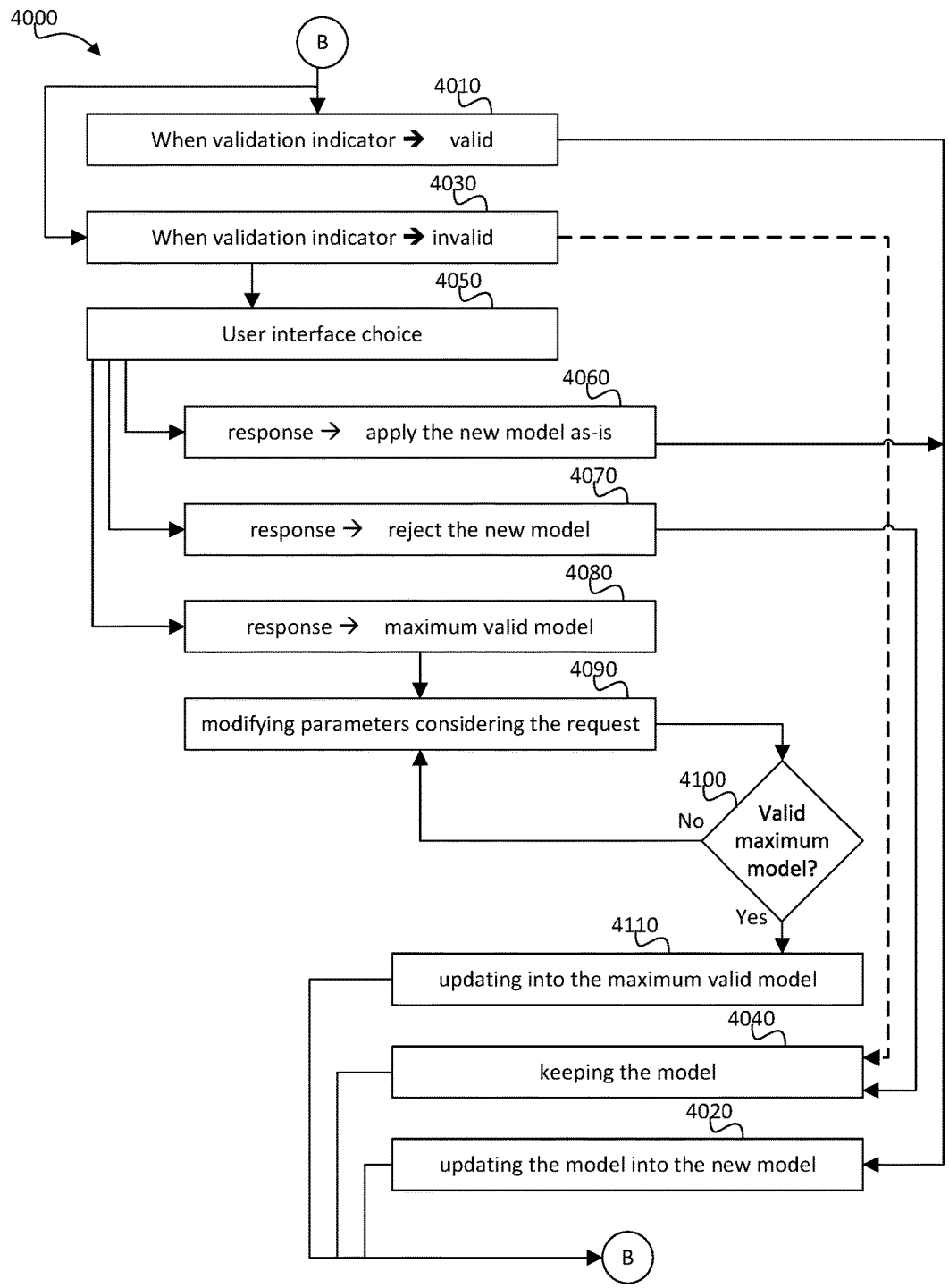
FIG. 4 is a more detailed flow chart of a second portion of the exemplary method depicted in FIG. 2, in accordance with the teachings of the present invention.

Reference is now concurrently made to FIGS. 1, 2, 3 and 4. FIG. 2 is a flow chart of an exemplary method 2000 for dynamically updating a model associated to a simulated interactive object of an interactive computer simulation. FIGS. 3 and 4 are more detailed flow charts of portions 3000 and 4000 of the exemplary method 2000 depicted in FIG. 2, in accordance with the teachings of the present invention.

The method 2000 comprises running the interactive computer simulation in the computer system 1000. More precisely, the interactive computer simulation may be run from the processor module 1130 of the simulation computing device 1100. The interactive computer simulation comprises the simulated interactive object in a computer generated environment. The display module 1150 (and optionally 1310) may be used to display images from the interactive computer simulation. At least one interactive instrument from the instrument module 1140 is also provided.

In real-time during the interactive computer simulation, monitoring 2010 of the interactive instrument module is performed (e.g., by the processor module 1130). The monitoring 2010 awaits user inputs causing a simulated behavior of the simulated interactive object considering the model associated thereto. The images from the interactive computer simulation shown on one or more display screen(s) of the display module 1150/1310 are related to, among other things, the simulated behavior of the simulated interactive object.

The method 2000 then follows, after reception of a request to modify the model associated to the simulated interactive object, with determining 2020 a new model associated to the simulated interactive object (e.g., by the processor module 1130). An example 3000 of the receipt of a request to modify the model and associated determination 2020 of the new model is provided with particular reference to FIG. 3. The example 3000 is provided with a simulated aircraft as an example of simulated interactive object. In the example 3000, a first user interface choice 3010 is provided allowing certain aspects of the simulated aircraft model to be affected by a modification. For instance, it may be possible to select for modification one or more of the flight regimes that have specific modeled aspects (low speed, hover, high speed, high alpha, etc.) or to select all of them.

A second user interface choice 3020 is then provided to adjust one or more interrelated parameters applicable to the selected simulated vehicle. In the present example 3000, the interrelated parameters are referred to as tuning factors. Examples of tuning factors related to the simulated aircraft include drag, side-force, lift, pitch, roll, yaw and power profile. The user interface may allow a modification request to a single one or to more than one of the tuning factors. For instance, the modification request for a given tuning factor may be provided through a slidable indicator (e.g., one-dimension or two-dimension chart or value selector) or through an input box (e.g., a numerical value (e.g., "10.1, 110%, −20%") or a relative marker ("increase by 10%", "as much as possible", etc.)). The modification request, even if it comprises only a single value or command (or compound value), may affect more than one tuning factors.

Once the selected tuning factors are adjusted through the user interface, intermediate model values in relation to the modification request may need to be updated 3030. The update 3030 may involve calculation 3032 of appropriate derivatives and/or update 3034 to the power profile related to the simulated vehicle. The derivatives typically include translational velocity derivatives, angular velocity derivatives and control derivatives. The power profile typically comprises induced power value, profile power value and other power-related parameters. In the depicted example, the update 3030 also involves updating all of the coefficients related to the tuning factors, considering interrelations that exist between them.

From updated equations of motion applicable to the updated model are thereafter calculated 3050, which completes the determination 2020 in the example of FIG. 2.

Once determined 2020, the new model is validated 2030 (e.g., by the processor module 1130). A validation indicator is computed from a plurality of interrelated parameters of the new model and a plurality of simulated constraints associated to the computer generated environment (e.g., gravitational force, atmospheric pressure, etc.).

The model associated to the simulated interactive object is then selectively and dynamically updated 2040 (e.g., by the processor module 1130) into the new model considering at least the validation indicator. An example 4000 of the selective and dynamic update 2040 is provided with particular reference to FIG. 3.

For instance, when the validation indicator shows that the new model is valid 4010, then the method 2000 follows with updating the model into the new model 4020, which completes the selective and dynamic update 2040.

A first option when the validation indicator shows that the new model is invalid 4030 is to readily reject the new model. The method 2000 then follows with keeping the model 3040, which completes the selective and dynamic update 2040.

A second option when the validation indicator shows that the new model is invalid 4030 is to provide 4050 a user interface choice. Upon receipt of a response from the user interface choice to apply the new model as-is 4060, then the method 2000 follows with updating the model into the new model 4020, which completes the selective and dynamic update 2040. Upon receipt of a response from the user interface choice to reject the new model 4070, the method 2000 then follows with keeping the model 4040, which completes the selective and dynamic update 2040.

The response from the user interface choice may also indicate to update the model into a maximum valid model 4080. In such a case, the method 2000 follows with modifying 4090 one or more interrelated parameters from the plurality interrelated parameters considering the request. A new model is then determined from the modified parameters from 4090 until the new model corresponds to the maximum valid model 4100. The method 2000 then follows with updating 4110 the model into the maximum valid model, which completes the selective and dynamic update 2040.

Following the selective and dynamic update 2040, the at least one interactive instrument module is monitored 2050 in real-time during the interactive computer simulation for additional user inputs (e.g., by the processor module 1130). The additional user inputs cause an updated simulated behavior of the simulated interactive object in the interactive computer simulation correspondingly considering the model or the new model associated thereto based on the selective and dynamic update 2040. The interactive computer simulation then generates additional images shown on the at least one display screen of the display module 1150 in relation to the updated behavior.

In some embodiments, the model comprises a plurality of original interrelated parameters. The simulated behavior of the simulated interactive object is originally based on the original plurality of interrelated parameters. Determining 2020 the new model may comprise computing the plurality of interrelated parameters based on the received request. As can be readily expected, one or more of the plurality of interrelated parameters is different when compared to the corresponding plurality of original interrelated parameters. The request may comprise a target value for a single parameter of the plurality of interrelated parameters. In such an example, the request may be made for validating the effect of modifying the single parameter in the interactive computer simulation.

As exemplified in the FIG. 3000, the method 2000 may further comprise receiving the request to modify the model. The request may comprise a target value for one or more of the plurality of interrelated parameters.

The received request may also comprise a compound target value for updating one or more behavioral aspects of the model into the updated behavior. Validating 2030 the new model may then further comprise computing one or more of the plurality of interrelated parameters of the new model from the compound target value. The method 2000 may further comprise after reception of the request to modify the model in 2020, pausing (not shown) the interactive computer simulation for allowing determination 2020, validation 2030 and update 2040 of the new model. After selectively and dynamically updating 2040 the model into the new model, the method 2000 may then comprise resuming the interactive computer simulation.

The received request may also comprise a random model request and determining 2020 the new model associated to the simulated interactive object may then comprise providing a random model associated to the simulated interactive object.

The received request may also comprise a model identification request and determining 2020 the new model associated to the simulated interactive object may then comprise providing an existing model associated to an identifiable version of the simulated interactive object.

Modification requests may be received from the IOS 1300 associated to the interactive computer simulation and/or from the interactive instrument module 1140.

Various network links may be implicitly or explicitly used in the context of the depicted embodiments. While a link may be depicted as a wired link, it could also be embodied as a wireless link using a coaxial cable, an optical fiber, a category 5 cable, and the like. A wired or wireless access point (not shown) may be present on the link therebetween. Likewise, any number of routers (not shown) may be present and part of the link, which may further pass through the Internet.

The present invention is not affected by the way in which the different modules exchange information between them. For instance, the memory module 1120 and the processor module 1130 could be connected by a parallel bus, but could also be connected by a serial connection or involve an intermediate module (not shown) without affecting the teachings of the present invention.

A method is generally conceived to be a self-consistent sequence of steps leading to a desired result. These steps require physical manipulations of physical quantities. Usually, though not necessarily, these quantities take the form of electrical or magnetic/electromagnetic signals capable of being stored, transferred, combined, compared, and otherwise manipulated. It is convenient at times, principally for reasons of common usage, to refer to these signals as bits, values, parameters, items, elements, objects, symbols, characters, terms, numbers, or the like. It should be noted, however, that all of these terms and similar terms are to be associated with the appropriate physical quantities and are merely convenient labels applied to these quantities.

The description of the present invention has been presented for purposes of illustration but is not intended to be exhaustive or limited to the disclosed embodiments. Many modifications and variations will be apparent to those of ordinary skill in the art. The embodiments were chosen to explain the principles of the invention and its practical applications and to enable others of ordinary skill in the art to understand the invention in order to implement various embodiments with various modifications as might be suited to other contemplated uses.

What is claimed is:

1. A method for dynamically updating a model associated to a simulated interactive object in an interactive computer simulation, the method comprising:
    running the interactive computer simulation comprising the simulated interactive object in a computer generated environment of the interactive computer simulation via a computer system comprising a display module, at least one interactive instrument module and a processor module;
    in real-time during the interactive computer simulation, monitoring via the processor module the at least one interactive instrument module for user inputs causing a simulated behavior of the simulated interactive object considering the model associated thereto, wherein images from the interactive computer simulation are shown on at least one display screen of the display module in relation to the simulated behavior;
    after reception of a request to modify the model associated to the simulated interactive object, determining a new model via the processor module associated to the simulated interactive object;
    validating via the processor module the new model associated to the simulated interactive object by computing via the processor module a validation indicator from:
        a plurality of interrelated parameters of the new model; and
        a plurality of simulated constraints associated to the computer generated environment;
    selectively and dynamically updating the model via the processor module associated to the simulated interactive object into the new model considering at least the validation indicator;
    in real-time during the interactive computer simulation, monitoring via the processor module the at least one interactive instrument module for additional user inputs causing an updated simulated behavior of the simulated interactive object in the interactive computer simulation correspondingly considering the model or the new model associated thereto, wherein additional images from the interactive computer simulation are shown on the at least one display screen of the display module in relation to the updated behavior; and
    when the validation indicator shows that the new model is invalid, providing a user interface choice to apply the new model as-is.

2. The method of claim 1, wherein the simulated interactive object is a simulated aircraft, wherein:
    the plurality of interrelated parameters comprises:
        a drag value, a side-force value, a lift value, a pitch value, a roll value, a yaw value and a power profile;
    the plurality of simulated constraints associated to the computer generated environment comprises:
        gravitational force and atmospheric pressure.

3. The method of claim 1, wherein the model comprises a plurality of original interrelated parameters, the simulated interactive object exhibiting the simulated behavior based on the original plurality of interrelated parameters and wherein determining the new model comprises computing via the processor module the plurality of interrelated parameters, one or more of the plurality of interrelated parameters being different when compared to the corresponding plurality of original interrelated parameters.

4. The method of claim 3, wherein the request comprises a target value for a single parameter of the plurality of interrelated parameters, the request being for validating via the processor module the effect of modifying the single parameter in the interactive computer simulation.

5. The method of claim 3, further comprising receiving the request to modify the model comprising a target value for one or more of the plurality of interrelated parameters.

6. The method of claim 1, further comprising receiving the request comprising a compound target value for updating one or more behavioral aspects of the model into the updated behavior.

7. The method of claim 6, wherein validating via the processor module the new model further comprises computing via the processor module one or more of the plurality of interrelated parameters of the new model from the compound target value.

8. The method of claim 1, wherein selectively and dynamically updating via the processor module the model into the new model considering at least the validation indicator further comprises:
    when the validation indicator shows that the new model is valid, updating the model into the new model; and
    when the validation indicator shows that the new model is invalid, providing the user interface choice and:
        upon receipt of a response from the user interface choice to apply the new model as-is, updating via the processor module the model into the new model;
        upon receipt of a response from the user interface choice to reject the new model, keeping the model; and
        upon receipt of a response from the user interface choice to update the model into a maximum valid model:
            until the new model corresponds to the maximum valid model, modifying via the processor module one or more interrelated parameters from the plurality interrelated parameters considering the request; and
            updating via the processor module the model into the maximum valid model.

9. The method of claim 1, further comprising:
    after reception of the request to modify the model, pausing via the processor module the interactive computer simulation for allowing determination, validation and update of the new model; and
    after selectively and dynamically updating via the processor module the model into the new model, resuming the interactive computer simulation.

10. The method of claim 1, wherein the request comprises a random model request and wherein determining via the processor module the new model associated to the simulated interactive object comprises providing via the processor module a random model associated to the simulated interactive object.

11. The method of claim 1, wherein the request comprises a model identification request and wherein determining via the processor module the new model associated to the simulated interactive object comprises providing via the processor module an existing model associated to an identifiable version of the simulated interactive object.

12. The method of claim 1, further comprising receiving the request from an Instructor Operating Station (IOS) associated to the interactive computer simulation being performed on the computer system comprising the display module, the at least one interactive instrument module and the processor module.

13. The method of claim 1, further comprising receiving the request from the interactive instrument module of the computer system.

14. A computer system for dynamically updating a model associated to a simulated interactive object in an interactive computer simulation, the computer system comprising:
   a display module;
   an interactive instrument module for receiving user inputs related to the simulated interactive object in the interactive computer simulation;
   a processor module configured to:
      run the interactive computer simulation comprising the simulated interactive object in a computer generated environment of the interactive computer simulation;
      in real-time during the interactive computer simulation, monitor the interactive instrument module for the user inputs;
      upon receipt of the user inputs, cause a simulated behavior of the simulated interactive object in the interaction computer simulation considering the model and the user inputs;
      cause the display module to display images, on at least one display screen, from the interactive computer simulation in relation the simulated behavior;
      after receipt of a request to modify the model associated to the simulated interactive object, determine a new model associated to the simulated interactive object;
      validate the new model associated to the simulated interactive object by computing a validation indicator from:
         a plurality of interrelated parameters of the new model; and
         a plurality of simulated constraints associated to the computer generated environment;
      selectively and dynamically update the model associated to the simulated interactive object into the new model considering at least the validation indicator;
      in real-time during the interactive computer simulation, monitor the interactive instrument module for additional user inputs;
      cause an updated simulated behavior of the simulated interactive object in the interactive computer simulation considering the additional user inputs and, correspondingly, the model or the new model associated to the simulated interactive object;
      cause the display module to display additional images, on the at least one display screen, from the interactive computer simulation in relation to the updated simulated behavior; and
      when the validation indicator shows that the new model is invalid, provide a user interface choice to apply the new model as-is.

15. The computer system of claim 14, wherein the model comprises a plurality of original interrelated parameters, the simulated interactive object exhibiting the simulated behavior based on the original plurality of interrelated parameters and wherein determining the new model comprises computing the plurality of interrelated parameters, one or more of the plurality of interrelated parameters being different when compared to the corresponding plurality of original interrelated parameters.

16. The computer system of claim 14, wherein the processor module, when selectively and dynamically updating the model into the new model considering at least the validation indicator, is further configured to:
   when the validation indicator shows that the new model is valid, update the model into the new model; and
   when the validation indicator shows that the new model is invalid, provide the user interface choice and:
      upon receipt of a response from the user interface choice to apply the new model as-is, update the model into the new model;
      upon receipt of a response from the user interface choice to reject the new model, keep the model; and
      upon receipt of a response from the user interface choice to update the model into a maximum valid model:
         until the new model corresponds to the maximum valid model, modify one or more interrelated parameters from the plurality interrelated parameters considering the request; and
         update the model into the maximum valid model.

17. The computer system of claim 14, wherein the processor module is further configured to:
   after reception of the request to modify the model, pause the interactive computer simulation for allowing determination, validation and update of the new model; and
   after selectively and dynamically updating the model into the new model, resume the interactive computer simulation.

18. The computer system of claim 14 further comprising a network interface module for receiving the request from an Instructor Operating Station (IOS).

* * * * *